United States Patent
Lee et al.

(10) Patent No.: US 10,854,786 B2
(45) Date of Patent: Dec. 1, 2020

(54) TRANSPARENT LIGHT EMITTING DEVICE DISPLAY

(71) Applicant: LG CHEM, LTD., Seoul (KR)

(72) Inventors: Kun Seok Lee, Daejeon (KR); Yong Goo Son, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 30 days.

(21) Appl. No.: 16/466,491

(22) PCT Filed: Sep. 20, 2018

(86) PCT No.: PCT/KR2018/011121
§ 371 (c)(1),
(2) Date: Jun. 4, 2019

(87) PCT Pub. No.: WO2019/066379
PCT Pub. Date: Apr. 4, 2019

(65) Prior Publication Data
US 2019/0319171 A1    Oct. 17, 2019

(30) Foreign Application Priority Data

Sep. 26, 2017 (KR) .......................... 10-2017-0124169

(51) Int. Cl.
*H01L 33/42* (2010.01)
*H01L 27/15* (2006.01)
*H01L 49/02* (2006.01)
*H01L 33/38* (2010.01)

(52) U.S. Cl.
CPC .............. *H01L 33/42* (2013.01); *H01L 27/15* (2013.01); *H01L 28/60* (2013.01); *H01L 33/38* (2013.01); *H01L 2933/0016* (2013.01)

(58) Field of Classification Search
None
See application file for complete search history.

(56) References Cited

U.S. PATENT DOCUMENTS

| | | |
|---|---|---|
| 2007/0257901 A1 | 11/2007 | Gotou et al. |
| 2010/0156840 A1 | 6/2010 | Frey et al. |
| 2013/0000959 A1 | 1/2013 | Park et al. |
| 2014/0209355 A1 | 7/2014 | Lebens et al. |
| 2015/0060120 A1 | 3/2015 | Park |
| 2015/0062449 A1 | 3/2015 | Park |
| 2015/0077361 A1 | 3/2015 | Seo et al. |
| 2016/0029475 A1 | 1/2016 | Hwang et al. |
| 2016/0044778 A1 | 2/2016 | Irie et al. |
| 2016/0245491 A1 | 8/2016 | Kim |

(Continued)

FOREIGN PATENT DOCUMENTS

| | | |
|---|---|---|
| KR | 10-0743940 | 7/2007 |
| KR | 10-2013-0002122 | 1/2013 |

(Continued)

*Primary Examiner* — Vip Patel
(74) *Attorney, Agent, or Firm* — Dentons US LLP

(57) ABSTRACT

A transparent light emitting device display comprising a transparent substrate; at least one light emitting device provided on the transparent substrate; and a first common electrode wiring unit, a second common electrode wiring unit, and a signal electrode wiring unit provided on the transparent substrate, in which the first common electrode wiring unit, the second common electrode wiring unit, and the signal electrode wiring unit comprise a metal mesh pattern.

12 Claims, 4 Drawing Sheets

(56) References Cited

U.S. PATENT DOCUMENTS

| | | |
|---|---|---|
| 2016/0306464 A1 | 10/2016 | Lee |
| 2017/0229531 A1 | 8/2017 | Shi et al. |
| 2017/0243342 A1 | 8/2017 | Iwami |
| 2018/0049318 A1 | 2/2018 | Maki |
| 2018/0329534 A1 | 11/2018 | Hwang et al. |

FOREIGN PATENT DOCUMENTS

| | | |
|---|---|---|
| KR | 10-2015-0031917 | 3/2015 |
| KR | 10-20150026876 | 3/2015 |
| KR | 10-2016-0031294 | 3/2016 |
| KR | 10-20160103818 | 9/2016 |
| KR | 10-2016-0122934 | 10/2016 |
| KR | 10-1689131 | 12/2016 |
| KR | 10-2017-0021417 | 2/2017 |
| KR | 10-2017-0027380 | 3/2017 |
| KR | 10-2017-0058394 | 5/2017 |
| WO | 2005-104248 | 11/2005 |
| WO | 2012/094842 | 7/2012 |
| WO | 2014-156489 | 10/2014 |
| WO | 2016178322 | 11/2016 |
| WO | 2017-111540 | 6/2017 |

[Figure 1]
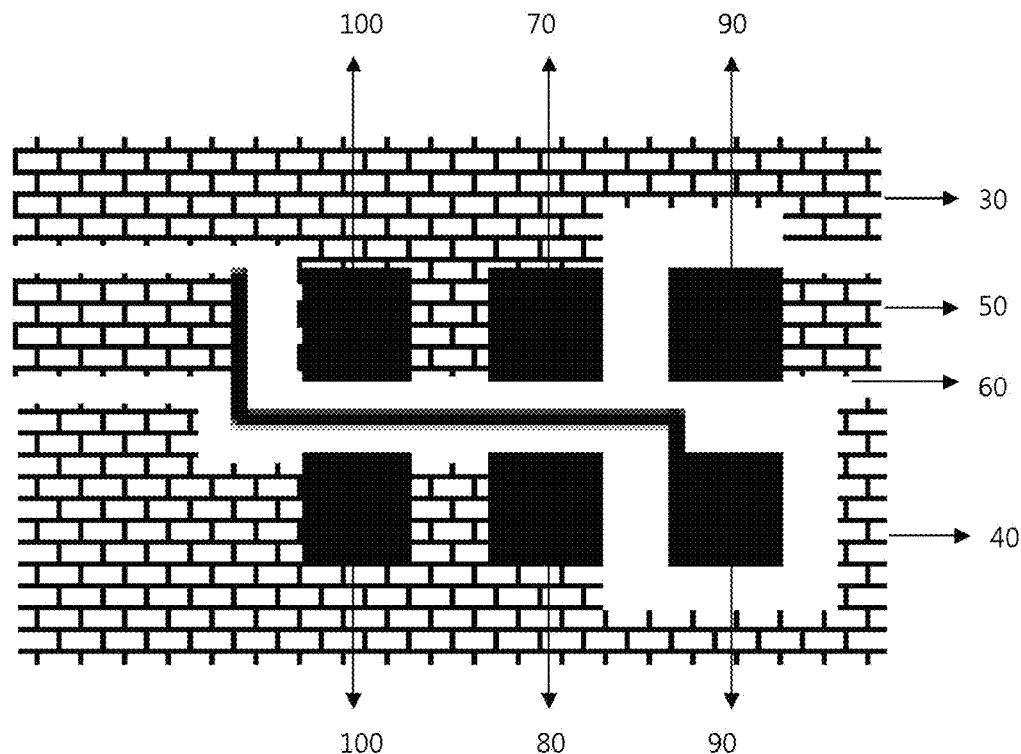
[Figure 2]
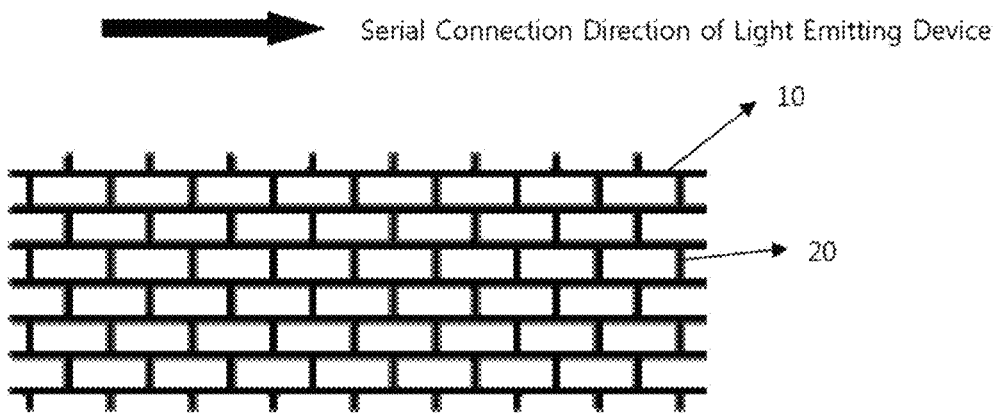

[Figure 3]
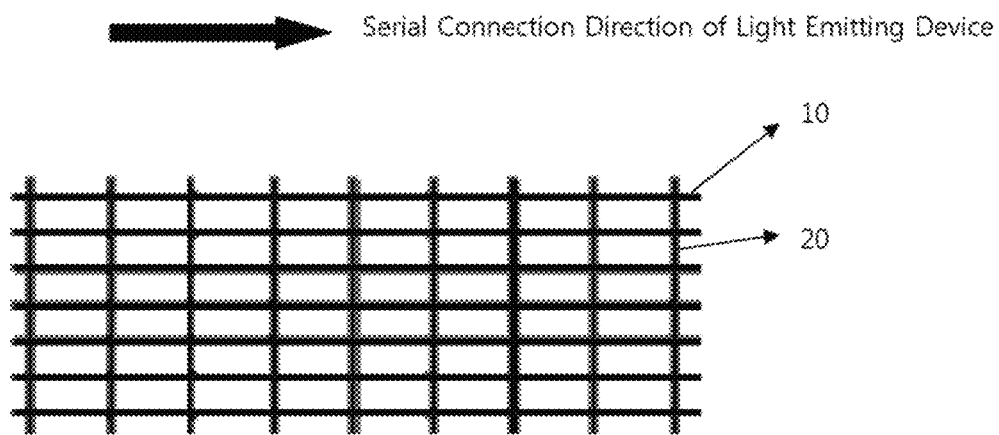
[Figure 4]
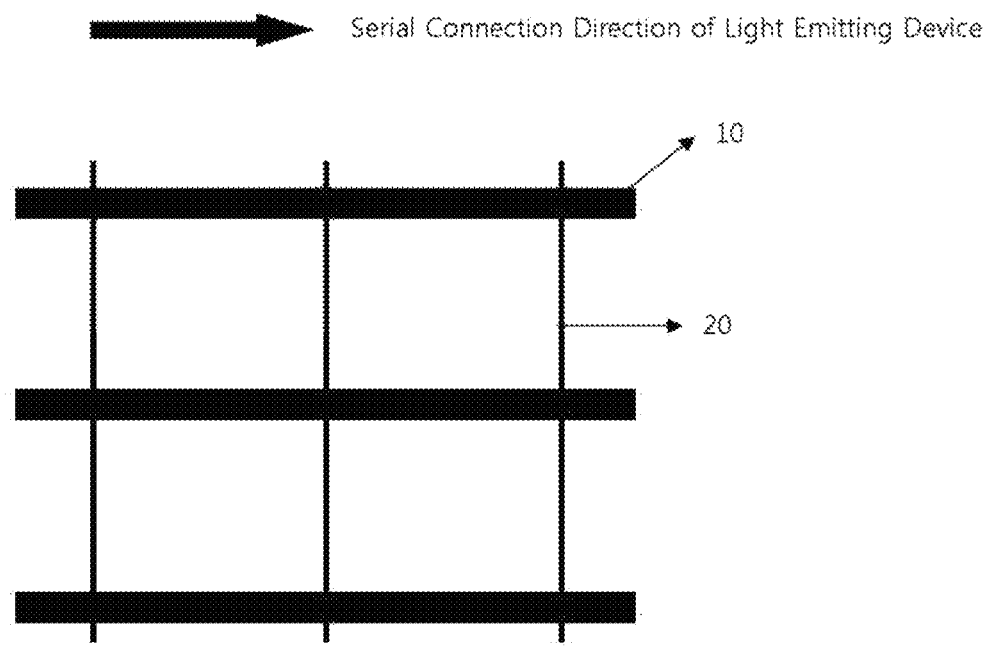

[Figure 5]
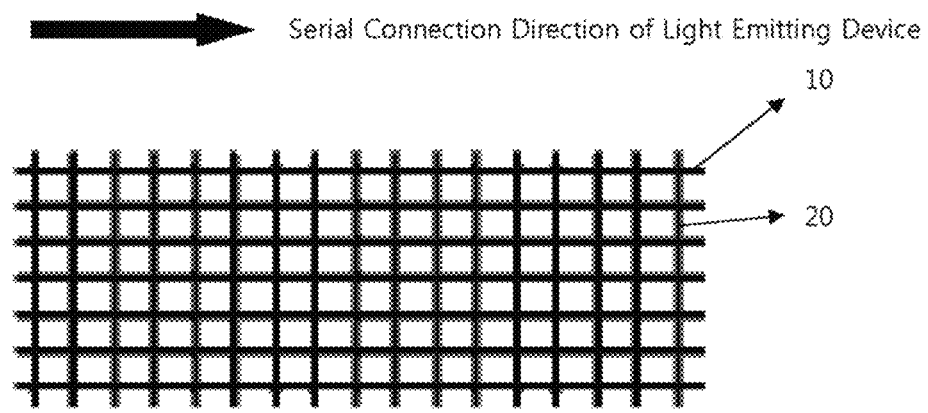
[Figure 6]
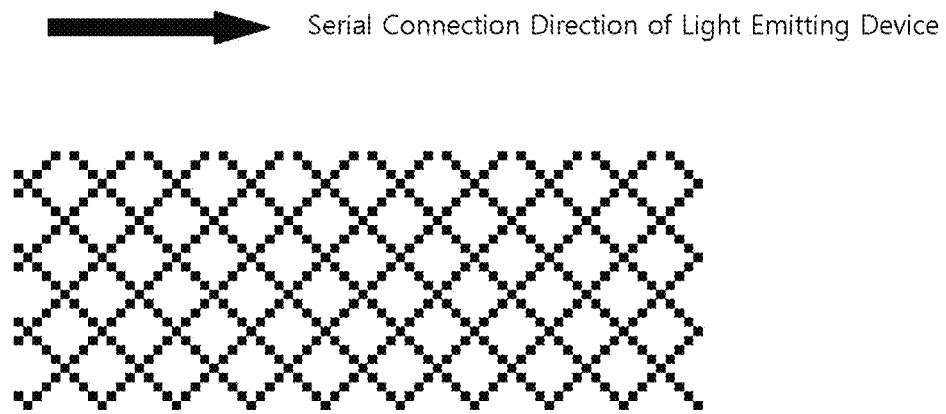
[Figure 7]
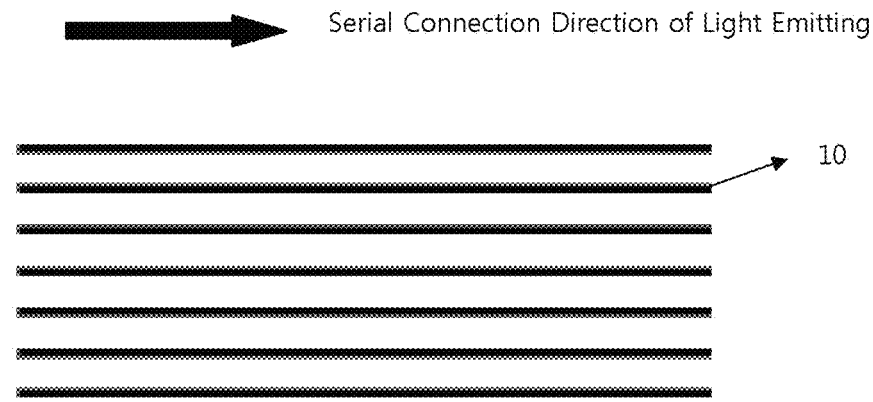

[Figure 8]
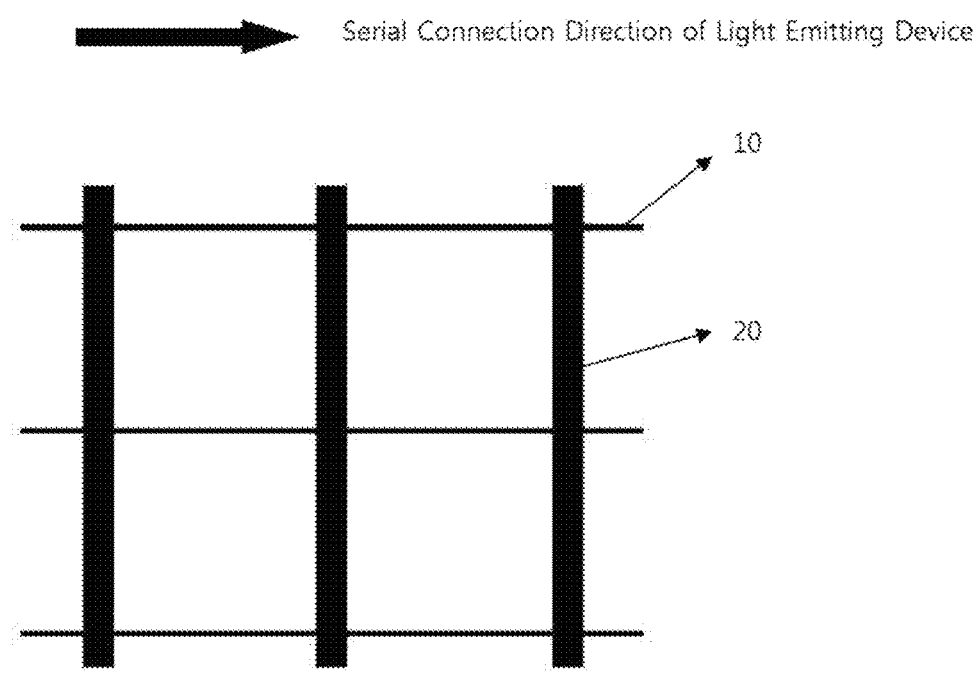
[Figure 9]
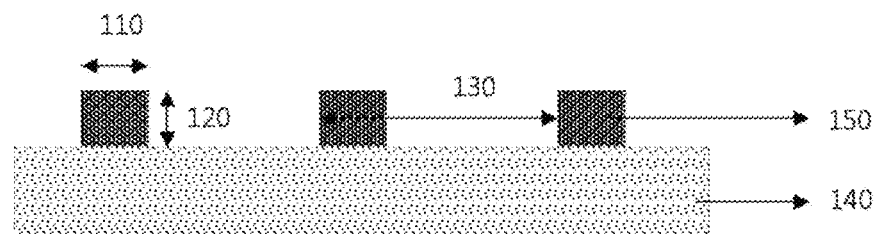

TRANSPARENT LIGHT EMITTING DEVICE DISPLAY

CROSS-REFERENCE TO RELATED APPLICATIONS

This application is a National Stage Application of International Application No. PCT/KR2018/011121 filed on Sep. 20, 2018, which claims priority to and the benefit of Korean Patent Application No. 10-2017-0124169 filed in the Korean Intellectual Property Office on Sep. 26, 2017, the entire contents of which are incorporated herein by reference.

TECHNICAL FIELD

The present application relates to a transparent light emitting device display.

BACKGROUND ART

Recently, Korea creates various exterior lighting in parks and town centers, as well as colorful signs, and provides information and attraction to urban residents through the convergence of high-tech information and communication technology (ICT) and light emitting diode (LED) technology. Particularly, a transparent LED display using a transparent electrode material adopts an LED between glass, and has an advantage in that wires are not viewed, so that it is possible to display light with high quality. Accordingly, the transparent LED display is utilized in the interior of a hotel, a department store and the like, and has increasing importance in implementing media façade of an exterior wall of a building.

According to a spread of a smart device, demands of a transparent electrode, which is transparent, is electrically conducted, and is used in a touch screen and the like, are explosive, and the most widely used transparent electrode among the transparent electrodes is an indium tin oxide (ITO) that is an oxide of indium and tin. However, reserves of indium, which is a main raw material of the material of the ITO transparent electrode, are not largely available globally and indium is produced only in some countries, such as China, and production cost of indium is high. Further, indium has a disadvantage in that indium has a high resistance value and does not adopt a constant resistance value, so that an expressed light beam of an LED cannot display desired brightness and brightness is not uniform. Accordingly, the transparent LED utilizing ITO has a limit in being utilized as a transparent electrode material with high performance and low cost.

It is a fact that the ITO has been most dominantly used as a transparent electrode material, but research and technology development utilizing a new material are continuously conducted due to a limit in economic feasibility, restricted performance, and the like. As a transparent electrode material attracting attention as a next-generation new material, there are metal mesh, an Ag nanowire, carbon nano tube (CNT), conductive polymer, graphene, and the like. Among them, the metal mesh is a new material, which occupies 85% of a material replacing the ITO, is low cost and has high conductivity, so that a market of the metal mesh is expanded in an aspect of utilization of the metal mesh.

The transparent LED display utilizing the metal mesh has excellent conductivity, is easily repaired and maintained, is capable of saving resources, is capable of considerably preventing environmental contamination, and is economical by a decrease in manufacturing cost, compared to an existing transparent display. Further, the transparent LED display utilizing the metal mesh can be expansively applied for various purposes and can be applied to and utilized in various products as a new transparent electrode material.

DISCLOSURE

TECHNICAL PROBLEM

The present application is aimed at providing a transparent light emitting device display using a metal mesh pattern.

TECHNICAL SOLUTION

An exemplary embodiment of the present application provides a transparent light emitting device display comprising: a transparent substrate; at least two light emitting devices provided on the transparent substrate; and a first common electrode wiring unit, a second common electrode wiring unit, and a signal electrode wiring unit provided on the transparent substrate, in which the first common electrode wiring unit, the second common electrode wiring unit, and the signal electrode wiring unit comprise a metal mesh pattern, and the metal mesh pattern is provided in a region having an area of 80% or more of an entire area of an upper surface of the transparent substrate, at least two light emitting devices are serially connected with the signal electrode wiring unit, the metal mesh pattern is formed of parallel wires parallel to the serial connection direction and vertical wires vertical to the parallel wires, and a ratio of a closing ratio of the parallel wires per unit area expressed by Equation 2 to a closing ratio of the vertical wires per unit area expressed by Equation 1 is 1.5 to 10.

Closing ratio (%) of vertical wires per unit area= $(W1/P1) \times 100$   Equation 1

Closing ratio (%) of parallel wires per unit area= $(W2/P2) \times 100$   Equation 2

In Equations 1 and 2, W1 is a line width of the vertical wire, P1 is pitch of the vertical wire, W2 is a line width of the parallel wire, and P2 is pitch of the parallel wire.

ADVANTAGEOUS EFFECTS

According to an exemplary embodiment of the present application, it is possible to decrease visibility of the wire by applying the metal mesh pattern, in which the line widths, the pitch, and the like of the vertical wire and the parallel wire are adjusted, to the first common electrode wiring unit, the second common electrode wiring unit, and the signal electrode wiring unit. Further, the metal mesh pattern is provided on the entire region of the effective screen unit of the upper surface of the transparent substrate, except for the region, in which the light emitting devices are provided, so that it is possible to maximize an extent of the common electrode wiring unit and reduce resistance.

Further, according to an exemplary embodiment of the present application, it is possible to decrease visibility of the wire by minimizing a width of the disconnection portion, which separates the metal mesh patterns of the first common electrode wiring unit, the second common electrode wiring unit, and the signal electrode wiring unit from one another.

Further, according to an exemplary embodiment of the present application, it is possible to increase an aperture ratio of the metal mesh pattern without a loss of resistance by decreasing the closing ratio of the vertical wire vertical to the current direction.

DESCRIPTION OF THE DRAWINGS

FIG. 1 is a diagram schematically illustrating electrode wiring of a transparent light emitting device display according to an exemplary embodiment of the present application.

FIG. 2 is a diagram schematically illustrating a metal mesh pattern according to Example 1 of the present application.

FIG. 3 is a diagram schematically illustrating a metal mesh pattern according to Example 2 of the present application.

FIG. 4 is a diagram schematically illustrating a metal mesh pattern according to Example 3 of the present application.

FIG. 5 is a diagram schematically illustrating a metal mesh pattern according to Comparative Example 1 of the present application.

FIG. 6 is a diagram schematically illustrating a metal mesh pattern according to Comparative Example 2 of the present application.

FIG. 7 is a diagram schematically illustrating a metal mesh pattern according to Comparative Example 3 of the present application.

FIG. 8 is a diagram schematically illustrating a metal mesh pattern according to Comparative Example 4 of the present application.

FIG. 9 is a diagram schematically illustrating a line width, a line height, and pitch of the metal mesh pattern according to an exemplary embodiment of the present application.

EXPLANATION OF REFERENCE NUMERALS AND SYMBOLS

10: parallel wire
20: vertical wire
30: first common electrode wiring portion
40: second common electrode wiring portion
50: signal electrode wiring portion
60: disconnection portion
70: first common electrode pad unit
80: second common electrode pad unit
90: signal electrode pad unit
100: capacitor pad unit
110: line width of metal mesh pattern
120: line height of metal mesh pattern
130: pitch of metal mesh pattern
140: transparent substrate
150: metal mesh pattern

BEST MODE FOR CARRYING OUT THE INVENTION

Hereinafter, the present application will be described in detail.

A transparent light emitting diode (LED) display provides various attraction for urban residents through an information providing service and producing spectacle, and demands thereof are increasing in various fields. It is a fact that an indium tin oxide (ITO) has been most dominantly used as a transparent electrode material until now, but research and technology development utilizing a new material are continuously conducted due to a limit in economic feasibility, restricted performance, and the like.

More particularly, in implementing a transparent LED display in the related art, transparent electrode wiring is formed by adopting an Ag nanowire or a transparent metal oxide (ITO, indium zinc oxide (IZO), and the like). However, the AG nanowire or the transparent metal oxide (ITO, IZO, and the like) has high resistance, but there is a limit in manufacturing a transparent LED display to have a large area due to a limit in the number of LEDs driven. Further, when a thickness of the Ag nanowire or the transparent metal oxide is increased in order to reduce resistance, there is a problem in that transmittance of the transparent LED display deteriorates.

In this respect, the present application is characterized in that, in order to provide a transparent light emitting device display having an excellent resistance characteristic and visibility, a metal mesh pattern is applied to transparent electrode wiring of a transparent light emitting device display.

The metal mesh pattern can use a method of increasing a line width or pitch of the metal mesh pattern in order to increase transmittance. However, when a line width or pitch of the metal mesh pattern is increased, there can be a problem in that resistance is increased. In this respect, in the present application, an aperture ratio of the metal mesh pattern is increased without a loss of resistance by decreasing a closing ratio of a wire vertical to a current direction.

A transparent light emitting device display according to an exemplary embodiment of the present application comprises: a transparent substrate; at least two light emitting devices provided on the transparent substrate; and a first common electrode wiring unit, a second common electrode wiring unit, and a signal electrode wiring unit provided on the transparent substrate, in which the first common electrode wiring unit, the second common electrode wiring unit, and the signal electrode wiring unit comprise a metal mesh pattern, the metal mesh pattern is provided in a region having an area of 80% or more of a total area of an upper surface of the transparent substrate, at least two light emitting devices are serially connected with the signal electrode wiring unit, the metal mesh pattern is formed of parallel wires parallel to the serial connection direction and vertical wires vertical to the parallel wires, and a ratio of a closing ratio of the parallel wires per unit area expressed by Equation 2 to a closing ratio of the vertical wires per unit area expressed by Equation 1 is 1.5 to 10.

In the present application, the parallel wire parallel to the serial connection direction does not mean only the wire completely parallel to the serial connection direction, and can also comprise the parallel wire having a parallel deviation of ±2°. Further, the vertical wire vertical to the parallel wire does not mean only the wire completely vertical to the parallel wire, and can also comprise the vertical wire having a vertical deviation of ±5°.

According to an exemplary embodiment of the present application, only the parallel wire parallel to the serial connection direction involves resistance, so that it is possible to increase an aperture ratio without a loss of resistance of the metal mesh pattern.

When the ratio of the closing ratio of the parallel wires per unit area expressed by Equation 2 to the closing ratio of the vertical wires per unit area expressed by Equation 1 is less than 1.5, an effect in improving transmittance or resistance can be small. Further, when the ratio of the closing ratio of the parallel wires per unit area expressed by Equation 2 to the closing ratio of the vertical wires per unit area expressed by Equation 1 is larger than 10, short-circuit vulnerability can be increased or the wires can exceed pattern implementation performance, and there can be a problem in that a pattern is visible.

The ratio of the closing ratio of the parallel wires per unit area expressed by Equation 2 to the closing ratio of the vertical wires per unit area expressed by Equation 1 can be more preferably 1.5 to 6, but is not limited thereto.

In the present application, a line width of the parallel line can be larger than or equal to a line width of the vertical line. Further, a closing ratio of the metal mesh pattern per unit area expressed by Equation 3 below can be 5% to 30%.

Closing ratio of metal mesh pattern per unit area={(P2×W1+P1×W2−W1×W2)/(P1×P2)}×100  [Equation 3]

In Equation 3, W1, W2, P1, and P2 have the same definition as those of Equations 1 and 2.

When the closing ratio of the metal mesh pattern per unit area expressed by Equation 3 is less than 5%, there can be a problem in that the LED is not driven, and when the closing ratio of the metal mesh pattern per unit area expressed by Equation 3 exceeds 30%, there is a problem in that transmittance is decreased, so that the metal mesh pattern cannot serve as a transparent electrode.

The closing ratio of the metal mesh pattern per unit area expressed by Equation 3 can be more preferably 5% to 20%, but is not limited thereto.

In an exemplary embodiment of the present application, at least four electrode pad units, which electrically connect the first common electrode wiring unit, the second common electrode wiring unit, and the signal electrode wiring unit with the light emitting devices, can be provided between the transparent substrate and each of the light emitting devices. In this case, the metal mesh pattern is not be provided in at least partial regions among at least four electrode pad units as illustrated in FIG. 1.

In an exemplary embodiment of the present application, two or more light emitting devices can be provided on the transparent substrate, and the two or more light emitting devices can be serially connected with the signal electrode wiring unit. The number of light emitting devices can be appropriately selected by those skilled in the art in consideration of a usage of the transparent light emitting device display, and is not particularly limited. More particularly, the number of light emitting devices is related to resistance of an electrode, and when an electrode has sufficiently low resistance and an area of the display is large, the number of light emitting devices can be increased. When the number of light emitting devices in the same area is increased, resolution becomes high, and when the number of light emitting devices is increased with the same interval, an area of the display can be increased and electric lines of a power supply unit can be decreased, so that the number of light emitting devices can be appropriately selected by those skilled in the art in consideration of a usage of the transparent light emitting device display.

In an exemplary embodiment of the present application, the two or more light emitting devices can be serially connected with the signal electrode wiring unit, and can be connected with the first common electrode wiring unit and the second common electrode wiring unit in parallel. The first common electrode wiring unit and the second common electrode wiring unit provide the amount of current enough to drive the light emitting devices, and a color signal of the light emitting device can be transmitted only with a low current, so that the first common electrode wiring unit and the second common electrode wiring unit can be serially connected with the signal electrode wiring unit. When all of the light emitting devices are connected with the power supply unit through the electrodes thereof, respectively, in parallel, not in the structure of the present application, for the driving and the transmission of the signals of all of the light emitting devices, it is necessary to vary each electrode width in order to meet a resistance value according to a disposition distance of the light emitting device (a width of the electrode connected to the farthest light emitting device is largest), and it is difficult to configure an electrode of low resistance due to a spatial limit in an electrode disposition region according to the characteristic in that the plurality of light emitting devices is provided.

In an exemplary embodiment of the present application, the signal electrode wiring unit can be provided between the first common electrode wiring unit and the second common electrode wiring unit.

In an exemplary embodiment of the present application, the first common electrode wiring unit can be a positive (+) common electrode wiring unit and the second common electrode wiring unit can be a negative (−) common electrode wiring unit. Further, the first common electrode wiring unit can be a negative (−) common electrode wiring unit and the second common electrode wiring unit can be a positive (+) common electrode wiring unit.

Electrode wiring of the transparent light emitting device display according to an exemplary embodiment of the present application is schematically illustrated in FIG. 1.

According to an exemplary embodiment of the present application, a channel is formed in a structure, in which the signal electrode wiring unit passes between the positive (+) common electrode wiring unit and the negative (−) common electrode wiring unit, so that each light emitting device does not have a separate electrode wire, and can be connected to the positive (+) common electrode wiring unit and the negative (−) common electrode wiring unit as a common electrode.

In an exemplary embodiment of the present application, at least four electrode pad units, which electrically connect the first common electrode wiring unit, the second common electrode wiring unit, and the signal electrode wiring unit with the light emitting devices, can be provided between the transparent substrate and each of the light emitting devices. According to an exemplary embodiment of the present application, four electrode pad units, which connect the first common electrode wiring unit, the second common electrode wiring unit, and the signal electrode wiring unit with the light emitting devices, can be provided between the transparent substrate and each of the light emitting devices.

In an exemplary embodiment of the present application, the four electrode pad units can comprise two signal electrode pad units, one first common electrode pad unit, and one second common electrode pad unit. The two signal electrode pad units are signal in-out pad units of the light emitting devices and can be provided at distal ends of the signal electrode wiring units, respectively, and the first common electrode pad unit and the second common electrode pad unit can be provided at distal ends of the first common electrode wiring unit and the second common electrode wiring unit, respectively. The distal end means a region, on which the light emitting device is provided and is electrically connected with the first common electrode wiring unit, the second common electrode wiring unit, and the signal electrode wiring unit.

Further, at least one capacitor pad unit can be additionally provided on the transparent substrate. In an exemplary embodiment of the present application, the number of capacitor pad units can be two.

The capacitor pad unit is a pad, to which a capacitor is attached, and the capacitor can serve to stabilize a current supplied to the light emitting device.

The electrode pad units of the transparent light emitting device display according to an exemplary embodiment of the present application are schematically illustrated in FIG. 1. FIG. 1 is a diagram illustrating the case where the transparent light emitting device display comprises four electrode pad units and two capacitor pad units.

More particularly, in FIG. 1, a first common electrode wiring unit 30 can be a positive (+) common electrode wiring unit and a second common electrode wiring unit 40 can be a negative (−) common electrode wiring unit. Further, in FIG. 1, a signal electrode pad unit 90, which is a signal in-out pad unit of the light emitting device, is an electrode pad unit provided to be connected to a distal end of the signal electrode wiring unit, the first common electrode pad unit 70, which is a positive (+) pad unit of the light emitting device, is an electrode pad unit provided to be connected to a distal end of the positive (+) common electrode wiring unit, and the second common electrode pad unit 80, which is a negative (−) pad unit of the light emitting device, is an electrode pad unit provided to be connected to a distal end of the negative (−) common electrode wiring unit. Further, the capacitor pad unit 100 can comprise a capacitor positive (+) pad unit and a negative (−) pad unit.

Each of the first common electrode pad unit, the second common electrode pad unit, the signal electrode pad unit, and the capacitor pad unit does not comprise a metal mesh pattern, and an entire region of each of the pad units can be formed of metal. More particularly, the first common electrode pad unit, the second common electrode pad unit, and the signal electrode pad unit are portions hidden by the welded light emitting devices, so that the first common electrode pad unit, the second common electrode pad unit, and the signal electrode pad unit do not comprise the metal mesh pattern, and the entire region of each of the first common electrode pad unit, the second common electrode pad unit, and the signal electrode pad unit can be formed of metal.

A gap between the electrode pad unit and the capacitor pad unit can be independently 0.1 mm to 1 mm. By the gap, it is possible to prevent a short-circuit phenomenon in consideration of clearance when a solder paste is screen-printed for forming the light emitting device later.

The forms of the electrode pad unit and the capacitor pad unit are not particularly limited, and can be quadrangles. Further, each of a size of the electrode pad unit and the capacitor pad unit can be independently 0.1 mm$^2$ to 1 mm$^2$, but is not limited thereto.

The four electrode pad units can be bonded to one light emitting device. That is, in an exemplary embodiment of the present application, when the plurality of light emitting devices is provided on the transparent substrate, each of the light emitting devices can be bonded to the four electrode pad units.

In an exemplary embodiment of the present application, the first common electrode pad unit, the second common electrode pad unit, and the signal electrode pad unit can comprise the metal mesh pattern, and the metal mesh pattern can be provided in an entire region of an effective screen unit of an upper surface of the transparent substrate, except for the regions, in which the light emitting devices are provided. More particularly, the metal mesh pattern can be provided in a region having an area of 80% or more of the entire area of the upper surface of the transparent substrate, and can be provided in a region having an area of 99.5% or less. Further, the metal mesh pattern can be provided in a region having an area of 80% or more of an area, in which a FPCB pad unit region and a light emitting device pad unit region provided on the transparent substrate are excluded, based on the entire area of the upper surface of the transparent substrate, and can be provided in a region having an area of 99.5% or less. In the present application, the FPCB pad unit region comprises an FPCB pad unit applying external power, and an area of the FPCB pad unit region can be equal to or larger than an entire area of an FPCB pad unit, and be equal to or smaller than three times the entire area of the FPCB pad unit. Further, in the present application, the light emitting device pad unit region can comprise the electrode pad unit, and an area of the light emitting device pad unit region can be equal to or larger than 1.5 times an entire area of the electrode pad unit, and be equal to or smaller than three times the entire area of the electrode pad unit.

In an exemplary embodiment of the present application, the pattern form in the art can be used as the metal mesh pattern of the first common electrode wiring unit, the second common electrode wiring unit, and the signal electrode wiring unit. More particularly, the metal mesh pattern can comprise a quadrangular pattern.

The metal mesh pattern can be provided in the entire region of the effective screen unit of the upper surface of the transparent substrate, except for the region, in which the light emitting devices are provided, so that it is possible to secure a maximally allowable wiring region, thereby improving a resistance characteristic of the transparent light emitting device display. More particularly, surface resistance of the metal mesh pattern can be 0.1 Ω/sq or less.

Pitch of the metal mesh pattern can be 100 μm to 1,000 μm, can be 100 μm to 600 μm, and 100 μm to 300 μm, but can be adjusted by those skilled in the art based on desired transmittance and conductivity.

A material of the metal mesh pattern is not particularly limited, but can comprise one or more of metal and a metal alloy. The metal mesh pattern can comprise gold, silver, aluminum, copper, neodymium, molybdenum, nickel, or an alloy thereof, but is not limited thereto.

A line height of the metal mesh pattern is not particularly limited, but can be 1 μm or more in an aspect of conductivity of the metal mesh pattern and economic feasibility of a process of forming the metal mesh pattern, and can be 20 μm or less and can be 10 μm or less. More particularly, the line height of the metal mesh pattern can be 1 μm to 20 μm, and can be 1 μm to 10 μm.

A line width of the metal mesh pattern can be 50 μm or less, and can be 40 μm or less, but is not limited thereto. The smaller line width of the metal mesh pattern can be advantageous in an aspect of transmittance and wire visibility, but can cause a decrease in resistance, and in this case, when the line height of the metal mesh pattern is high, it is possible to improve the decrease in resistance. The line width of the metal mesh pattern can be 5 μm to or more.

An aperture ratio of the metal mesh pattern, that is, a ratio of an area, which is not covered by the pattern, can be 70% or more, 85% or more, and 95% or more.

In an exemplary embodiment of the present application, the aperture ratio of the metal mesh pattern can mean a ratio of an area, which is not covered by the metal mesh pattern, based on the area of the upper portion of the transparent substrate, and a closing ratio of the metal mesh pattern can mean a ratio of an area, which is covered by the metal mesh pattern, based on the area of the upper portion of the transparent substrate.

In an exemplary embodiment of the present application, the metal mesh patterns of the first common electrode wiring unit, the second common electrode wiring unit, and the signal electrode wiring unit can be separated from each other by a disconnection portion, in which the metal mesh pattern is not provided. The disconnection portion means a region, in which a part of the metal mesh pattern is disconnected to cut an electric connection. A width of the disconnection portion can mean a distance between the most adjacent distal ends among the first common electrode wiring unit, the second common electrode wiring unit, and the signal electrode wiring unit, which are spaced apart from one another. The width of the disconnection portion can be 80 μm or less, can be 60 μm or less, can be 40 μm or less, and can be 30 μm or less, but is not limited thereto. The width of the disconnection portion can be 5 μm or more.

According to an exemplary embodiment of the present application, it is possible to decrease visibility of the wire by minimizing a width of the disconnection portion, which separates the metal mesh patterns of the first common electrode wiring unit, the second common electrode wiring unit, and the signal electrode wiring unit.

Further, a line width 110, a line height 120, and pitch 130 of the metal mesh pattern according to an exemplary embodiment of the present application are schematically illustrated in FIG. 9. A line width, a line height, and pitch of the metal mesh pattern can be measured by using a method well known in the art. For example, the method can comprise a method of observing and measuring a scanning electron microscope (SEM) cross-section, a measurement method using a contactless surface shape measuring device (optical profiler), a measurement method using a stylus surface step measuring device (alpha step or surface profiler), and the like.

In an exemplary embodiment of the present application, each of the metal mesh patterns of the first common electrode wiring unit, the second common electrode wiring unit, and the signal electrode wiring unit can also be formed by an independent printing process, and can also be formed by one printing process at the same time. Accordingly, the metal mesh patterns of the first common electrode wiring unit, the second common electrode wiring unit, and the signal electrode wiring unit can have the same line height. In the present application, the same line height of the metal mesh patterns means that a standard deviation of a line height is 10% or less, preferably, 5% or less, and more preferably 2% or less.

In an exemplary embodiment of the present application, the printing method is used for forming the metal mesh patterns of the first common electrode wiring unit, the second common electrode wiring unit, and the signal electrode wiring unit, so that it is possible to form the metal mesh patterns of the first common electrode wiring unit, the second common electrode wiring unit, and the signal electrode wiring unit, which have the small line width and are precise, on the transparent substrate. The printing method is not particularly limited, and off-set printing, screen printing, gravure printing, flexographic printing, inkjet printing, nano-imprint, and the like can be used as the printing method, and a complex method comprising one or more of offset printing, screen printing, gravure printing, flexographic printing, inkjet printing, and nano-imprint can also be used. The printing method can use a roll to roll method, a roll to plate method, a plate to roll method, or a plate to plate method.

In an exemplary embodiment of the present application, in order to implement the precise metal mesh pattern, a reverse offset printing method can be applied. To this end, in the present application, there can be performed a method, in which an upper portion of silicon-based rubber, which is called a blanket, is entirely coated with ink, which can serve as the resist during etching, an unnecessary portion is firstly removed from the blanket through an intaglio, in which a pattern called a cliché is carved, a printing pattern left on the blanket is secondarily transferred to a base material, such as a film or glass, on which metal and the like is deposited, and then a desired pattern is formed through plasticizing and etching processes. When the method is used, the base material, on which metal is deposited, is used, so that uniformity of a line height is secured in the entire region and thus there is an advantage in that it is possible to uniformly maintain resistance in a thickness direction. In addition, the present application can comprise the direct printing method, in which conductive ink is directly printed by using the reverse offset printing method and then is plasticized to form a desired pattern. In this case, the line height of the pattern can be flattened by pressing impression pressure, and conductivity can be given by a thermoplastic process or microwave plasticizing process, a laser partial plasticizing process, and the like, which aim at connecting metal nano particles by mutual surface welding.

In the present application, as the transparent substrate, a glass substrate or a plastic substrate known in the art can be used, but the transparent substrate is not particularly limited thereto.

In the present application, the light emitting device provided on the transparent substrate can be formed by using a material and a method known in the art.

MODE FOR CARRYING OUT THE INVENTION

Hereinafter, an exemplary embodiment described in the present specification will be exemplified through Examples. However, this does not intend to limit the range of an exemplary embodiments by the Examples.

EXAMPLE

Example 1

Fabric, in which a transparent film (Polyester film V7200, SKC Company) is plated with Cu, and dry film resist (DFR) (SPG-152 of Asahi Chemical Industry) were laminated. Then, the laminated material was exposed by using a pattern mask and then was developed to form a desired DFR pattern. Then, a desired Cu wiring pattern was manufactured by etching Cu and peeling the DFR.

The form of the Cu wiring pattern of Example 1 is represented in FIG. 2.

The pitch of a parallel wire of the Cu wiring pattern of Example 1 was 200 μm, a line width of the parallel wire was 20 μm, the pitch of a vertical wire was 400 μm, and a line width of the vertical wire was 20 μm. Further, line heights of the parallel wire and the vertical wire of the Cu wire pattern were 2 μm.

Example 2

Except for the form of the Cu wiring pattern illustrated in FIG. 3, the method was identically performed to that of Example 1.

The pitch of a parallel wire of the Cu wiring pattern of Example 2 was 200 μm, a line width of the parallel wire was 20 μm, the pitch of a vertical wire was 400 μm, and a line width of the vertical wire was 20 μm. Further, line heights of the parallel wire and the vertical wire of the Cu wire pattern were 2 μm.

Example 3

Except for the form of the Cu wiring pattern illustrated in FIG. 4, the method was identically performed to that of Example 1.

The pitch of a parallel wire of the Cu wiring pattern of Example 3 was 200 μm, a line width of the parallel wire was 32 μm, the pitch of a vertical wire was 200 μm, and a line width of the vertical wire was 8 μm. Further, line heights of the parallel wire and the vertical wire of the Cu wire pattern were 2 μm.

Example 4

Except that pitch of a parallel wire of the Cu wiring pattern adopted was 100 μm, a line width of the parallel wire adopted was 25 μm, the pitch of a vertical wire adopted was 300 μm, and a line width of the vertical wire adopted was 25 μm, and line heights of the parallel wire and the vertical wire of the Cu wire pattern adopted was 8 μm in Example 1, the method was identically performed to that of Example 1.

Example 5

Except that the pitch of a parallel wire of the Cu wiring pattern adopted was 100 μm, a line width of the parallel wire adopted was 25 μm, the pitch of a vertical wire adopted was 600 μm, and a line width of the vertical wire adopted was 25 μm, and line heights of the parallel wire and the vertical wire of the Cu wire pattern adopted was 8 μm, the method was identically performed to that of Example 1.

Example 6

Except that the pitch of a parallel wire of the Cu wiring pattern adopted was 200 μm, a line width of the parallel wire adopted was 25 μm, the pitch of a vertical wire adopted was 600 μm, and a line width of the vertical wire adopted was 25 μm, and line heights of the parallel wire and the vertical wire of the Cu wire pattern adopted was 8 μm in Example 1, the method was identically performed to that of Example 1.

Comparative Example 1

Except for the form of the Cu wiring pattern illustrated in FIG. 5, the method was identically performed to that of Example 1.

The pitch of a parallel wire of the Cu wiring pattern of Comparative Example 1 was 200 μm, a line width of the parallel wire was 20 μm, the pitch of a vertical wire was 200 μm, and a line width of the vertical wire was 20 μm. Further, line heights of the parallel wire and the vertical wire of the Cu wire pattern were 2 μm.

Comparative Example 2

Except for the form of the Cu wiring pattern illustrated in FIG. 6, the method was identically performed to that of Example 1.

The pitch of the Cu wiring pattern of Comparative Example 2 was 200 μm and a line width of the Cu wiring pattern was 20 μm. Further, a line height of the Cu wire pattern was 2 μm.

Comparative Example 3

Except for the form of the Cu wiring pattern illustrated in FIG. 7, the method was identically performed to that of Example 1. The Cu wiring pattern of Comparative Example 3 was a pattern formed of only parallel wires, without vertical wires.

The pitch of the parallel wire of the Cu wiring pattern of Comparative Example 3 was 200 μm and a line width of the Cu wiring pattern was 20 μm. Further, a line height of the parallel wire of the Cu wiring pattern was 2 μm.

Comparative Example 4

Except for the form of the Cu wiring pattern illustrated in FIG. 8, the method was identically performed to that of Example 1.

The pitch of a parallel wire of the Cu wiring pattern of Example 4 was 200 μm, a line width of the parallel wire was 8 μm, the pitch of a vertical wire was 200 μm, and a line width of the vertical wire was 32 μm. Further, line heights of the parallel wire and the vertical wire of the Cu wire pattern were 2 μm.

Comparative Example 5

Except that the pitch of a parallel wire of the Cu wiring pattern adopted was 100 μm, a line width of the parallel wire adopted was 25 μm, the pitch of a vertical wire adopted was 100 μm, and a line width of the vertical wire adopted was 25 μm, and line heights of the parallel wire and the vertical wire of the Cu wire pattern adopted were 8 μm, the method was identically performed to that of Comparative Example 1.

Comparative Example 6

Except that the pitch of a parallel wire of the Cu wiring pattern adopted was 300 μm, a line width of the parallel wire adopted was 25 μm, the pitch of a vertical wire adopted was 300 μm, and a line width of the vertical wire adopted was 25 μm, and line heights of the parallel wire and the vertical wire of the Cu wire pattern adopted were 8 μm in Comparative Example 1, the method was identically performed to that of Comparative Example 1.

Experimental Example 1

Closing ratios, channel resistance, and short-circuit vulnerability of the Cu wiring patterns of Examples 1 to 3 and Comparative Examples 1 to 4 are evaluated and are represented in Table 1 below.

A closing ratio of the Cu wiring pattern was calculated by Equations 1 to 3, and channel resistance is a linear resistance value obtained by measuring resistance of both distal ends of a channel having a length of 17 mm and a width of 1.2 mm. Further, in the short-circuit vulnerability, in the case where the wires are short-circuited due to inflow of foreign substances, the case where the entire wires are electrically short-circuited is indicated by "NG" and the case where some wires are short-circuited, but an electric path can bypass is indicated by "OK".

TABLE 1

| | A/B | Closing ratio (%) | Channel resistance | Short-circuit vulnerability |
|---|---|---|---|---|
| Example 1 | 2 | 14.5 | 1.58 | OK |
| Example 2 | 2 | 14.5 | 1.58 | OK |
| Example 3 | 4 | 19.4 | 0.95 | OK |
| Comparative Example 1 | 1 | 19 | 1.58 | OK |
| Comparative Example 2 | 1 | 19 | 1.95 | OK |
| Comparative Example 3 | — | 10 | 1.58 | NG |

TABLE 1-continued

|  | A/B | Closing ratio (%) | Channel resistance | Short-circuit vulnerability |
|---|---|---|---|---|
| Comparative Example 4 | 0.25 | 19.4 | 4.74 | OK |

A: Closing ratio of parallel wire per unit area
B: Closing ratio of vertical wire per unit area Experimental Example 2

Closing ratios, channel resistance, and electrode transmittance of the Cu wiring patterns of Examples 4 and 5 and Comparative Example 5 are evaluated and represented in Table 2 below.

A closing ratio of the Cu wiring pattern was calculated by Equations 1 to 3, and channel resistance is a linear resistance value obtained by measuring resistance of both distal ends of a channel having a length of 660 mm and a width of 12 mm. Transmittance was obtained by measuring transmittance of a metal mesh pattern portion while avoiding an LED pad unit by using COH-400 equipment by Nippon Denshoku Company.

TABLE 2

|  | A/B | Closing ratio (%) | Channel resistance | Electrode transmittance |
|---|---|---|---|---|
| Example 4 | 3 | 23.7 | 0.9 | 66.4 |
| Example 5 | 6 | 18.6 | 1.0 | 70.8 |
| Comparative Example 5 | 1 | 38.0 | 0.9 | 53.9 |

A: Closing ratio of parallel wire per unit area
B: Closing ratio of vertical wire per unit area Experimental Example 3

Closing ratios, channel resistance, and LED lighting of the Cu wiring patterns of Example 6 and Comparative Example 6 were evaluated and represented in Table 3 below.

A closing ratio of the Cu wiring pattern was calculated by Equations 1 to 3, and channel resistance is a linear resistance value obtained by measuring resistance of both distal ends of a channel having a length of 660 mm and a width of 12 mm. Further, the LED lighting is based on whether the final serially connected LED is turned on, and the case where the final serially connected LED is turned on is indicated by "OK" and the case where the final serially connected LED is not turned on is indicated by "NG".

TABLE 3

|  | A/B | Closing ratio (%) | Channel resistance | Short-circuit vulnerability |
|---|---|---|---|---|
| Example 6 | 3 | 16.2 | 2.2 | OK |
| Comparative Example 6 | 1 | 15.9 | 3.5 | NG |

A: Closing ratio of parallel wire per unit area
B: Closing ratio of vertical wire per unit area As can be seen from the result, according to an exemplary embodiment of the present application, it is possible to decrease visibility of the wire by applying the metal mesh pattern, in which the line widths, the pitch, and the like of the vertical wire and the parallel wire are adjusted, to the first common electrode wiring unit, the second common electrode wiring unit, and the signal electrode wiring unit. Further, the metal mesh pattern is provided on the entire region of the effective screen unit of the upper surface of the transparent substrate, except for the region, in which the light emitting devices are provided, so that it is possible to maximize an extent of the common electrode wiring unit and reduce resistance.

Further, according to an exemplary embodiment of the present application, it is possible to decrease visibility of the wire by minimizing a width of the disconnection portion, which separates the metal mesh patterns of the first common electrode wiring unit, the second common electrode wiring unit, and the signal electrode wiring unit from one another.

Further, according to an exemplary embodiment of the present application, it is possible to increase an aperture ratio of the metal mesh pattern without a loss of resistance by decreasing the closing ratio of the vertical wire vertical to the current direction.

The invention claimed is:

1. A transparent light emitting device display, comprising:
a transparent substrate;
at least two light emitting devices provided on the transparent substrate; and
a first common electrode wiring unit, a second common electrode wiring unit, and a signal electrode wiring unit provided on the transparent substrate,
wherein the first common electrode wiring unit, the second common electrode wiring unit, and the signal electrode wiring unit comprise a metal mesh pattern, and the metal mesh pattern is provided in a region having an area of 80% or more of an entire area of an upper surface of the transparent substrate,
the at least two light emitting devices are serially connected with the signal electrode wiring unit,
the metal mesh pattern is formed of parallel wires parallel to the serial connection direction and vertical wires vertical to the parallel wires, and
a ratio of a closing ratio of the parallel wires per unit area expressed by Equation 2 to a closing ratio of the vertical wires per unit area expressed by Equation 1 is 1.5 to 10:

$$\text{Closing ratio (\%) of vertical wires per unit area} = (W1/P1) \times 100 \quad \text{Equation 1}$$

$$\text{Closing ratio (\%) of parallel wires per unit area} = (W2/P2) \times 100 \quad \text{Equation 2}$$

wherein W1 is a line width of the vertical wire, P1 is a pitch of the vertical wire, W2 is a line width of the parallel wire, and P2 is a pitch of the parallel wire.

2. The transparent light emitting device display of claim 1, wherein a ratio of a closing ratio of the parallel wires per unit area expressed by Equation 2 to a closing ratio of the vertical wires per unit area expressed by Equation 1 is 1.5 to 6.

3. The transparent light emitting device display of claim 1, wherein the line width of the parallel wire is larger than or equal to the line width of the vertical wire.

4. The transparent light emitting device display of claim 1, wherein a closing ratio of the metal mesh pattern per unit area, expressed by the following Equation 3, is 5% to 30%:

$$\text{Closing ratio of metal mesh pattern per unit area} = \{(P2 \times W1 + P1 \times W2 - W1 \times W2)/(P1 \times P2)\} \times 100 \quad \text{[Equation 3]}$$

wherein W1 is a line width of the vertical wire, P1 is a pitch of the vertical wire, W2 is a line width of the parallel wire, and P2 is a pitch of the parallel wire.

5. The transparent light emitting device display of claim 1, wherein at least four electrode pad units, which electrically connect the first common electrode wiring unit, the second common electrode wiring unit, and the signal electrode wiring unit with the light emitting devices, are provided between the transparent substrate and each of the light emitting devices, and the at least four electrode pad units comprise two signal electrode pad units, one first common electrode pad unit, and one second common electrode pad unit.

6. The transparent light emitting device display of claim 1, wherein the signal electrode wiring unit is provided between the first common electrode wiring unit and the second common electrode wiring unit.

7. The transparent light emitting device display of claim 1, wherein a line width of the metal mesh pattern is 50 μm or less, a pitch of the metal mesh pattern is 100 μm to 1,000 μm, and a line height of the metal mesh pattern is 1 μm or more.

8. The transparent light emitting device display of claim 1, wherein the metal mesh patterns of the first common electrode wiring unit, the second common electrode wiring unit, and the signal electrode wiring unit are separated from one another by a disconnection portion, in which the metal mesh pattern is not provided, and a width of the disconnection portion is 80 μm or less.

9. The transparent light emitting device display of claim 5, wherein a size of each of the electrode pad units is independently 0.1 $mm^2$ to 1 $mm^2$.

10. The transparent light emitting device display of claim 5, wherein a gap between the electrode pad units among the at least four electrode pad units is independently 0.1 mm to 1 mm.

11. The transparent light emitting device display of claim 1, wherein the metal mesh pattern comprises gold, silver, aluminum, copper, neodymium, molybdenum, nickel, or an alloy thereof.

12. The transparent light emitting device display of claim 1, wherein at least one capacitor pad unit is additionally provided on the transparent substrate.

* * * * *